United States Patent
Lu et al.

(10) Patent No.: US 9,935,678 B1
(45) Date of Patent: Apr. 3, 2018

(54) BROADBAND POWER LIMITER

(71) Applicant: pSemi Corporation, San Diego, CA (US)

(72) Inventors: Jianhua Lu, San Diego, CA (US); Hojung Ju, San Diego, CA (US); Chun-Cheng Wang, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/285,448

(22) Filed: Oct. 4, 2016

(51) Int. Cl.
| | |
|---|---|
| *H04B 1/06* | (2006.01) |
| *H04B 1/48* | (2006.01) |
| *H03K 5/08* | (2006.01) |
| *H04B 1/38* | (2015.01) |
| *H04B 1/16* | (2006.01) |

(52) U.S. Cl.
CPC ............. *H04B 1/48* (2013.01); *H03K 5/082* (2013.01); *H04B 1/38* (2013.01)

(58) Field of Classification Search
CPC .... H03H 11/24; H03H 11/245; G03G 1/0023; G03G 1/0029; G03G 1/007; G03G 1/0088; G03G 3/3015; G03G 2201/106; H02H 9/025; H03K 19/0013; H03K 19/0027
USPC .... 455/241.1, 245.2, 247.1, 249.1; 330/284; 327/308, 328; 333/81 R
See application file for complete search history.

(56) References Cited

U.S. PATENT DOCUMENTS

| | | | |
|---|---|---|---|
| 4,970,478 A | * | 11/1990 | Townley ............. H03H 11/245 333/23 |
| 7,890,891 B2 | | 2/2011 | Stuber et al. |
| 7,910,993 B2 | | 3/2011 | Brindle et al. |
| 8,129,787 B2 | | 3/2012 | Brindle et al. |
| 8,405,147 B2 | | 3/2013 | Brindle et al. |
| 8,742,502 B2 | | 6/2014 | Brindle et al. |
| 8,928,388 B2 | | 1/2015 | Lu et al. |
| 9,024,700 B2 | | 5/2015 | Ranta |
| 9,537,472 B2 | | 1/2017 | Lu et al. |

OTHER PUBLICATIONS

Lu, et al., "Adjustable Power Limiter with Integrated Power Detector" filed in the USPTO dated Oct. 4, 2016, U.S. Appl. No. 15/285,431, 32 pgs.

* cited by examiner

*Primary Examiner* — Lee Nguyen
(74) *Attorney, Agent, or Firm* — Jaquez Land Greenhaus LLP; Martin J. Jaquez, Esq.; John Land, Esq.

(57) ABSTRACT

A broadband power limiter having a distributed architecture of multiple segments of self-actuating, adjustable power limiters, where the limiter segments are separated from each other along a signal path by intermediate matching inductors. The intermediate matching inductors are chosen to form, in combination with the capacitances of the limiter segments, an impedance matched, low-loss, broadband transmission line. Optionally, limiter segments may be configured with different sizes and stack depths in a "tapered" architecture, such that different limiter segments have different power limiting response times and power handling capabilities. As each limiter segment initiates its power limiting action, power is reflected back toward the signal line, helping to trigger the power limiting action of the remaining limiter segments. Optionally, a power detector circuit may provide a more ideal limiting function by modulating the threshold power point of the limiter segments as a function of the transient signal voltage.

40 Claims, 9 Drawing Sheets

900

BROADBAND POWER LIMITER

CROSS-REFERENCE TO RELATED APPLICATIONS

The present application may be related to the following patent application, assigned to the assignee of the present invention, the entire disclosure of which is incorporated herein by reference as if set forth in full: U.S. patent application Ser. No. 15/285,431, filed Oct. 4, 2016, entitled "Adjustable Power Limiter with Integrated Power Detector".

BACKGROUND

(1) Technical Field

This invention relates to electronic circuitry, and more particularly to a broadband power limiter circuit.

(2) Background

Limiter circuits are used in electronic systems to limit power, voltage, or current to protect electrically connected "downstream" electronic devices from being damaged by excessive power, voltage, or current from a source, which may be an "upstream" power source, signal source, antenna, device being tested, etc. For example, radio frequency (RF) systems in particular must be designed to operate in the presence of other RF systems, most notably in the presence of other transmitters or RF sources which can impress high levels of RF energy into a particular system. Since RF system designers cannot know with any certainty what level of RF power might arrive, an RF limiter function is generally provided at the input of an RF system.

For example, FIG. 1 is a block diagram 100 of a prior art limiter 102 electrically connected to limit the power Ps from a source 104 delivered to a receiver 106 so as not to exceed a set output power level Po. The source 104 may be, for example, an antenna receiving transmitted RF signals from one or more transmitters, such as cellular telephone transmitters. The receiver 106 may be, for example, a hand-held cellular telephone or multi-band "smart phone". Thus, factors such as absolute transmitter power, proximity to transmitters, the amount of attenuation caused by the environment (e.g., being in a metal framed building versus being outdoors) will affect the strength of the power Ps from the source 104.

FIG. 2 is a graph 200 showing an ideal Ps-Po characteristic curve for the limiter of FIG. 1. At normal signal levels, the output Po of the limiter 102 linearly tracks the input Ps from the source 104 (see linear region depicted by graph line 202). However, at a designed threshold power point PTm, the output Po of the limiter 102 is significantly curtailed as the input Ps value increases above the threshold power point PTm, ideally passing no additional output power Po despite increases in input power Ps, at least until device failure occurs (see flat graph line 204).

There are fundamentally two types of limiters: fixed and adjustable. Fixed limiters, such as back-to-back P-i-N diodes coupled between circuit ground and the signal line between a source 104 and a receiver 106, have excellent response time and provide a near-ideal limiting function, but their threshold level cannot be adjusted. Further, fast P-i-N diodes are not available in certain semiconductor implementation processes, such as standard bulk silicon, silicon-on-insulator (SOI), and silicon-on-sapphire (SOS) processes, and thus generally are not available for integration with other circuitry.

As their name implies, adjustable limiters permit systems to limit power at various levels. Several examples of improved adjustable limiters are described in U.S. Pat. No. 8,928,388, issued Jan. 6, 2015, entitled "Self-Activating Adjustable Power Limiter", and in allowed U.S. patent application Ser. No. 14/527,712, filed Oct. 29, 2014, entitled "Integrated Switch and Limiter Circuit", both of which are assigned to the assignee of the present invention and hereby incorporated by reference as if set forth in full (hereafter, the "Adjustable Limiter References").

FIG. 3 is a schematic diagram of an example prior art circuit 300 utilizing a self-activating, adjustable threshold limiter 302 of the type taught in the Adjustable Limiter References. The limiter 302 includes a stack of one or more self-activating limiting elements 304_1 to 304_n that are series coupled between circuit ground and a signal line between a source 104 and a receiver 106. The limiting elements 304_1 to 304_n may be implemented as field effect transistors (FETs) M1-Mn, as shown in FIG. 3. The FETs M1-Mn may be, for example, NMOS or PMOS type MOSFETs.

For each FET M1-Mn, respective parasitic source-to-gate and drain-to-gate capacitors (e.g., $C1_D$, $C1_S$ to $Cn_D$, $Cn_S$) couple the drain and source of each FET to its gate, thereby dividing the RF power equally among the stack of FETs M1-Mn. Each FET M1-Mn also includes a corresponding gate resistor Rg1-Rgn, which is coupled to a corresponding control voltage Vctrl_1 to Vctrl_n; in many embodiments, the control voltages are provided from a single source and are thus equal. Further details of configuration and operation of the self-activating limiting elements 304_1 to 304_n are described in the Adjustable Limiter References.

Stacking multiple self-activating limiting elements 304_1 to 304_n provides a higher effective Vmax for the limiter 302 as a whole (i.e., a Vmax_total), where Vmax is normally the maximum voltage that may be applied to a single limiting element before it breaks down and starts its limiting function. For example, when the gate voltages for the n transistors M1-Mn of the stacked limiting elements 304_1 to 304_n are all set at the same Vctrl_x value, the limiter stack can stand off n times higher maximum voltage than a single limiting element—that is, Vmax_total=n*Vmax.

In the type of adjustable threshold limiter shown in FIG. 3, the limiting function is triggered when the signal voltage output by the source 104 exceeds the breakdown voltage of the stack of limiting elements 304_1 to 304_n, the gate voltages of which have been set by Vctrl_x to adjust the triggering threshold power level. FIG. 4 is a graph 400 showing the Ps-Po characteristic curve for a typical limiter of the type shown in FIG. 3. At sub-limiting signal levels, the output Po of the limiter 302 linearly tracks the input Ps from the source 104 (see linear region depicted by graph line 402). However, at a designed threshold power point $P_{TH}$ set by Vctrl_x, the output Po of the limiter 302 is significantly curtailed as the input Ps value increases above the threshold power point $P_{TH}$, exhibiting a limiting slope (see angled graph line 404). Because the limiting function is caused by breakdown voltage of the stack of limiting elements 304_1 to 304_n, it occurs with little to no response delay.

One drawback of adjustable limiters is that they often cannot limit as completely as fixed limiters. As shown in the graph of FIG. 2, in an ideal limiter, Po is clamped at the same value for all Ps levels above the threshold power point $P_{TH}$. Referring to FIG. 4, in a practical adjustable threshold limiter, Po continues to increase as Ps increases above the threshold power point $P_{TH}$, as shown by angled graph line 404. This increasing Po level can allow power leakage to transmit past the limiter 302 and into the protected receiver 106. Thus, while the adjustable limiter of FIG. 3 is flexible due to its adjustability and maintains the rapid response time of an ideal limiter, it has the disadvantage of higher power leakage than an ideal power limiter (comparing FIG. 4 to FIG. 2).

An adjustable power limiter with integrated power detector, as taught in the related co-pending U.S. Patent Application incorporated by reference above, mitigates or resolves the issue of a relatively high limiting slope. More particularly, an adjustable power limiter with integrated power detector relies upon the immediate limiting function of the adjustable, self-actuating limiter of FIG. 3 while adding in additional power limiting by adjusting control voltages to the stack of limiting elements 304_1 to 304_n as input power increases above the threshold power point $P_{TH}$. Accordingly, such a limiter combines a key advantage of fixed limiters—rapid response time—with a key advantage of adjustable power limiters—adjustability of the threshold power and low limiting slope.

However, all known limiters share a short-coming of limited bandwidth for RF frequencies. An ideal limiter would combine an adjustable threshold power point $P_{TH}$ with fast response time and low limiting slope along with a flat response curve over a wide bandwidth. The limiters described above have some but not all of these characteristics, and all of them exhibit limits on their bandwidth caused by input mismatch to an RF source.

In some cases, tradeoffs can be made to improve some of these characteristics. For example, the FETs of an adjustable power limiter can be made larger to reduce their ON resistance ($R_{ON}$) and thereby lower their limiting slope. However, making FETs larger (1) increases their internal parasitic capacitances, thus increasing their response time, (2) consumes more integrated circuit die area, and thus increases cost, and (3) degrades input match, decreasing bandwidth and lowering linearity.

Accordingly, there is a need for a limiter having all of the above described characteristics, including but not limited to the following: a fast response time, an adjustable limiting threshold, low limiting slope, broad bandwidth, and good linearity, while minimizing integrated circuit area and cost. It would also be valuable if such a limiter could be configured to handle high power, and can be fabricated monolithically, thereby integrating both control and other circuitry. These and other advantages are achieved by the present invention.

SUMMARY OF THE INVENTION

Embodiments of the invention encompass a broadband power limiter having a fast response time, an adjustable limiting threshold, low limiting slope, broad bandwidth, and good linearity, while minimizing integrated circuit area and cost. Such embodiments of the limiter may be configured to handle high power and can be fabricated monolithically, thereby enabling integration of both control circuits and other circuitry.

Embodiments of the invention provide a broadband power limiter having one or more of the following features: a distributed architecture of multiple self-actuating, adjustable power limiters; multiple self-actuating, adjustable power limiters with a "tapered" or "staggered" architecture; impedance matching elements between sets of multiple self-actuating, adjustable power limiters and to input and output terminals. Various embodiments may also include an integrated power detector.

In one distributed architecture embodiment, four limiter segments are coupled between circuit ground and a signal line between terminals RF1 and RF2. Each limiter segment comprises one or more stacks of field-effect transistors (FETs) configured as a self-activating, adjustable threshold power limiter of the type taught in the Adjustable Limiter References. Each of the corresponding gate resistors of the constituent FETs in the limiter segments is coupled to a common control voltage, Vctrl. The threshold power point $P_{TH}$ for the limiter segments can be adjusted by biasing the gates of the FETs with Vctrl, thereby changing the voltage at which the limiter segments start conducting, which sets the limiting threshold power point $P_{TH}$. Each limiter segment limits the input power Ps of a signal on the signal line when the voltage on the signal line exceeds the breakdown voltage of the series-coupled FETs in at least one limiter segment. Each limiter segment may be modeled as an equivalent capacitance. In accordance with the broadband power limiter concepts described below, the limiter segments are separated from each other along the signal path by associated intermediate matching inductors. The values of the intermediate matching inductors are chosen to form, in combination with the capacitances of the limiter segments, an impedance matched, low-loss, broadband transmission line between RF1 and RF2.

Optionally, the limiter segments in some embodiments may be configured with different sizes and stack depths in a "tapered" architecture, such that different limiter segments have different power limiting response times and power handling capabilities. As the input power Ps increases and exceeds the threshold power point $P_{TH}$, the smallest limiter segment will initiate its power limiting action before the other limiter segments. This, in turn, reflects some power back toward the input. The reflected power combines with the incoming power to increase the level of power seen by the other limiter segments, thereby triggering their power limiting action in a "staggered" fashion. Thus, as each additional limiter segment initiates its power limiting action, additional power is reflected back toward the input, helping to trigger the power limiting action of the remaining limiter segments. This power limiting process continues as Ps increases, until all limiter segments are in a power limiting mode.

Optionally, a fast-response integrated power detector circuit may be connected between a node on the signal line and the gate resistors of the FETs of the limiter segments to provide a more ideal limiting function by controlling the threshold power point of the limiter as a function of the transient signal voltage at the signal line node.

In addition, a limiter in accordance with the present invention can be "tuned" by an appropriate choice of design and component parameters during design and fabrication. Moreover, the linearity of a FET implementation of the limiter of the present invention can be improved by providing a means for sweeping out accumulated charge trapped below the gate oxide of the FETs The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Embodiments of the invention encompass a broadband power limiter having a fast response time, an adjustable limiting threshold, low limiting slope, broad bandwidth, and good linearity, while minimizing integrated circuit area and cost. Such embodiments of the limiter may be configured to handle high power and can be fabricated monolithically, thereby enabling integration of both control circuits and other circuitry.

Embodiments of the invention provide a broadband power limiter having one or more of the following features: a distributed architecture of multiple self-actuating, adjustable power limiters; multiple self-actuating, adjustable power limiters with a "tapered" or "staggered" architecture; impedance matching elements between sets of multiple self-actuating, adjustable power limiters and to input and output terminals. Various embodiments may also include an integrated power detector.

Bandwidth Concerns

Figure 5:
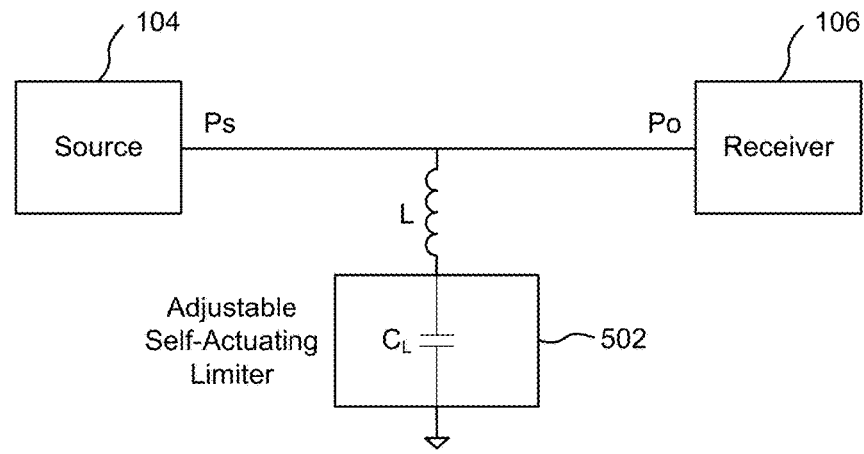
FIG. 5 is a block diagram of an adjustable self-actuating limiter electrically connected to limit the power Ps from a source delivered to a receiver so as not to exceed a set output power level Po.

Providing the features and benefits stated above entails understanding the causes of the problems to be solved, and the broadband nature of the invention. FIG. 5 is a block diagram 500 of an adjustable self-actuating limiter 502 electrically connected to limit the power Ps from a source 104 delivered to a receiver 106 so as not to exceed a set output power level Po; the adjustable self-actuating limiter 502 may be of the type shown in FIG. 3. A characteristic of such a limiter 502 is that its FET stack presents a substantial parasitic capacitance $C_L$, as indicated by the interior capacitor symbol. Accordingly, the limiter 502 presents one of two states to the signal path from the source 104 to the receiver 106.

In its OFF or non-limiting state ($Ps \leq P_{TH}$), the limiter 502 presents a high impedance signal block with substantial parasitic capacitance to the signal path. In it ON or limiting state ($Ps > P_{TH}$) state, the limiter 502 presents a low impedance shunt path to circuit ground with substantial parasitic capacitance to the signal path. In either case, with some amount of inductance L (intentional and/or parasitic, such as a bonding wire connection) between the limiter 502 and the signal path, the limiter 502 presents a resonant circuit, thereby causing narrow band operation. Even when the resonance of the circuit is far out of band, the highly capacitive nature of the FET stack in the limiter 502 causes an input and output impedance mismatch, limiting bandwidth. The bandwidth of the limiter 502 is therefore limited by the resonant performance of the limiter 502 itself.

Figure 6:
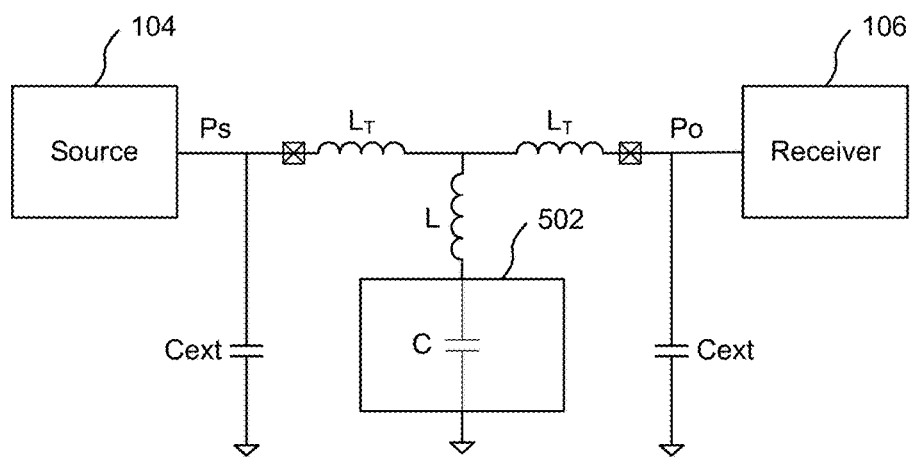
FIG. 6 is a block diagram of an improved version of the circuit of FIG. 5.

FIG. 6 is a block diagram 600 of an improved version of the circuit of FIG. 5. The bandwidth of the circuit configuration shown in FIG. 6 may be improved compared to the circuit configuration of FIG. 5 by adding impedance matching inductors $L_T$ to the input and output circuit segments, as shown. As one example, the impedance matching inductors $L_T$ may be bonding wires for coupling the limiter 502 to the source 104 and the receiver 106. Even further bandwidth improvement may be achieved by adding external shunt capacitors, Cext, from circuit ground to the input and output circuit segments, as shown, thus creating an improved impedance matching network similar to a conventional "pi" type impedance matching network.

Figure 7:
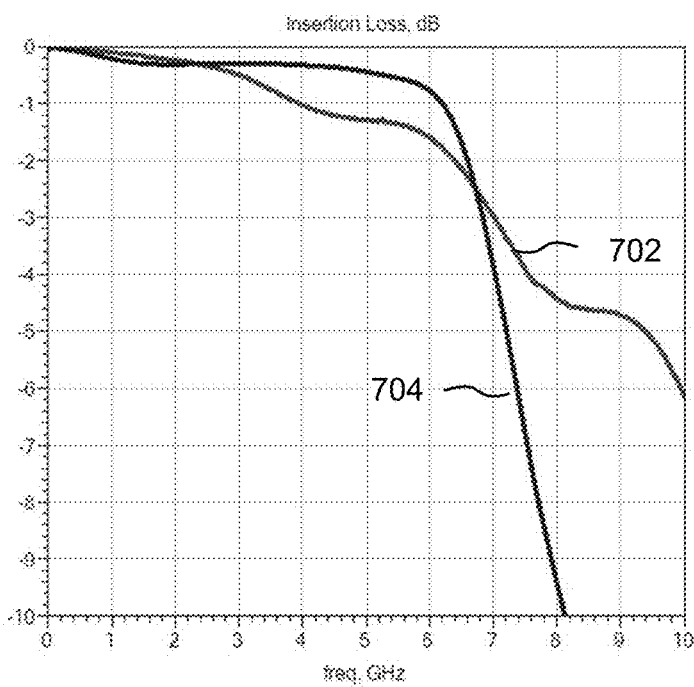
FIG. 7 is a graph of insertion loss (in dB) versus frequency (in GHz) for modeled embodiments of the circuit configurations of FIG. 5 and FIG. 6.
Figure 8:
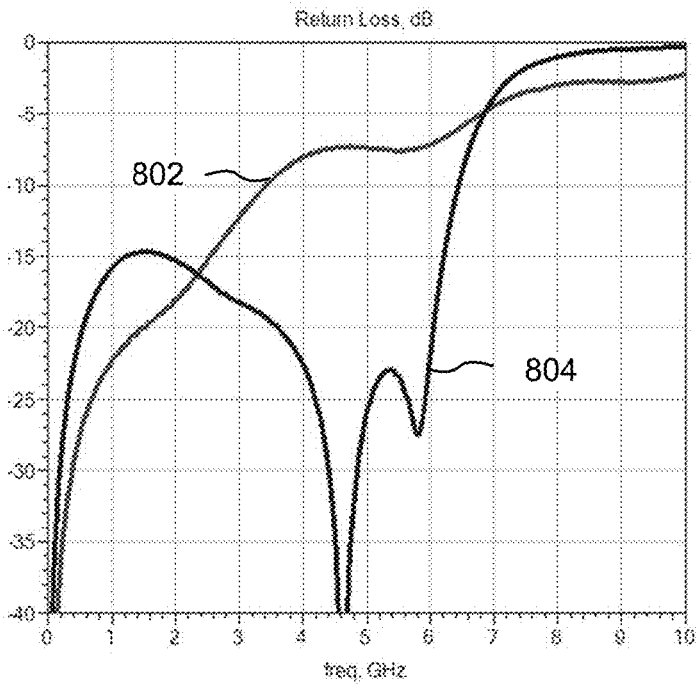
FIG. 8 is a graph of return loss (in dB) versus frequency (in GHz) for modeled embodiments of the circuit configurations of FIG. 5 and FIG. 6.

Impedance matching is traditionally measured by insertion loss and output return loss. FIG. 7 is a graph 700 of insertion loss (in dB) versus frequency (in GHz) for modeled embodiments of the circuit configurations of FIG. 5 and FIG. 6. Graph line 702 indicates the insertion loss of the circuit configuration of FIG. 5 (no added inductors $L_T$ or external capacitors Cext); graph line 704 indicates the insertion loss of the circuit configuration of FIG. 5 (with added inductors $L_T$ and external capacitors Cext). Similarly, FIG. 8 is a graph 800 of return loss (in dB) versus frequency (in GHz) for modeled embodiments of the circuit configurations of FIG. 5 and FIG. 6. Graph line 802 indicates the return loss of the circuit configuration of FIG. 5 (no added inductors $L_T$ or external capacitors Cext); graph line 804 indicates the return loss of the circuit configuration of FIG. 5 (with added inductors $L_T$ and external capacitors Cext). A person of ordinary skill will understand that the graph lines for the circuit configuration of FIG. 6 (with added impedance matching elements) shows improvement in both characteristics as compared to the circuit configuration of FIG. 5 (without added impedance matching elements).

Overview of Broadband Power Limiter Architecture

Figure 1:
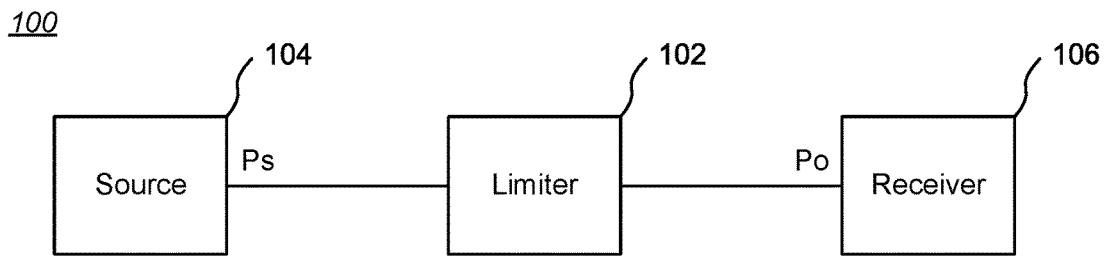
FIG. 1 is a block diagram of a prior art limiter electrically connected to limit the power Ps from a source delivered to a receiver so as not to exceed a set output power level Po.
Figure 2:
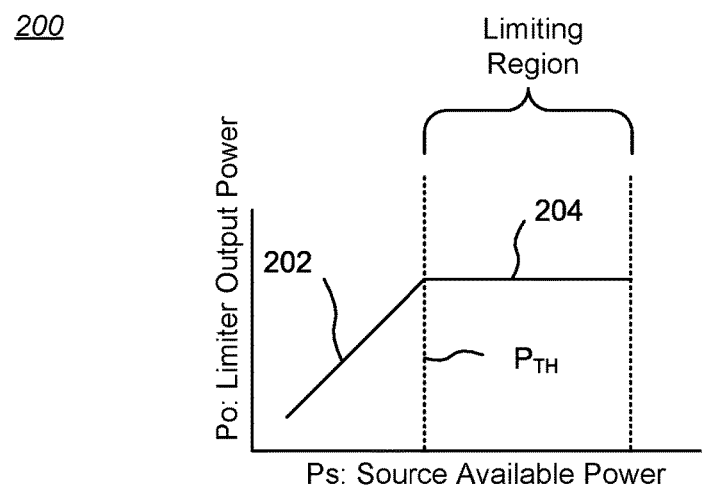
FIG. 2 is a graph showing an ideal Ps-Po characteristic curve for the limiter of FIG. 1.
Figure 3:
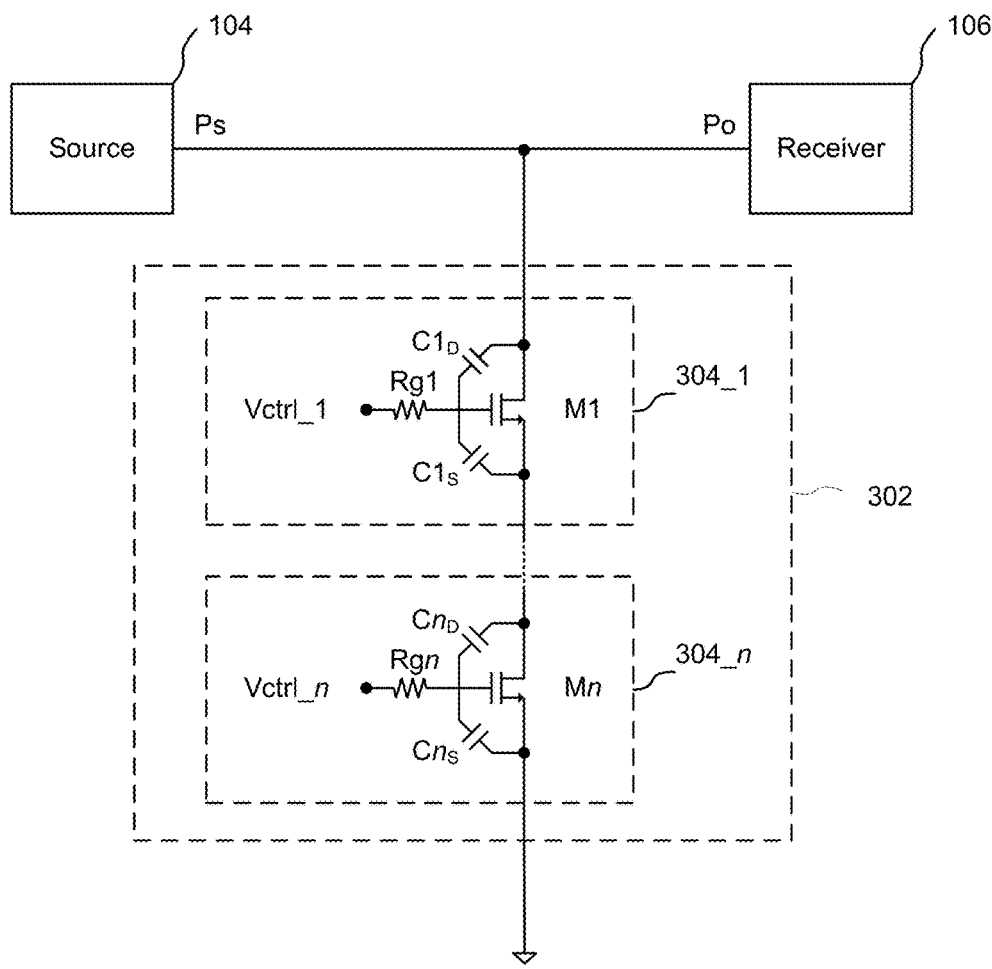
FIG. 3 is a schematic diagram of an example prior art circuit utilizing a self-activating, adjustable threshold limiter.
Figure 9:
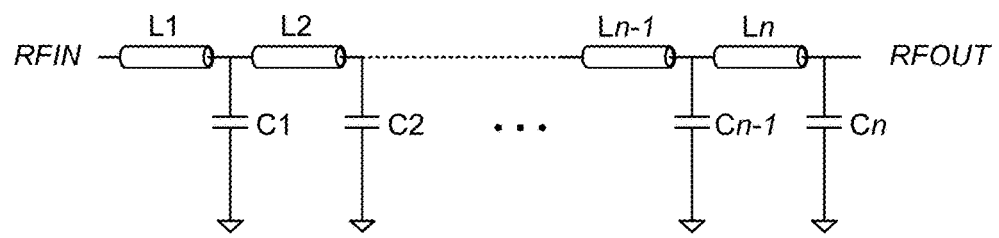
FIG. 9 is a schematic diagram of a conceptual solution to the problem of improving bandwidth of an adjustable self-actuating limiter circuit.

FIG. 9 is a schematic diagram 900 of a conceptual solution to the problem of improving bandwidth of a self-actuating limiter (adjustable or fixed). To extend the limiter's bandwidth, the total capacitance $C_L$ presented by the FET stack of a self-actuating limiter of the type shown in FIG. 3 is divided into multiple limiter segments (depicted as capacitors C1-Cn in FIG. 9 for the purposes of this discussion) such that the sum of the width of the limiter segments C1-Cn represents the desired limiting action. In addition, the limiter segments C1-Cn are separated by intermediate inductors L1-Ln such that the inductor-capacitor pairs present a transmission line to the signal path.

As a person of ordinary skill will understand, an L-C ladder as shown in FIG. 9 made of ideal inductors and capacitors represents a lossless transmission line and, in the ideal case, transmits power from its input RFIN to its output RFOUT in a perfectly impedance matched manner and over (theoretically) an infinite bandwidth. As noted above, the self-actuating limiter segments C1-Cn behave primarily as capacitors in both ON and OFF states, and therefore with proper design can become elements of such a transmission line (although not perfectly lossless, due to the ON resistance of the FETs in the limiter stack). However, the distributed architecture conceptually shown in FIG. 9 can significantly increase the bandwidth of the limiter, thereby reducing insertion loss.

A consequence of dividing a self-actuating limiter into multiple limiter segments is that additional benefits can be achieved. For example, the limiter segments C1-Cn need not all be identical in structure. This characteristic can be utilized to create an optional "tapered" architecture for the limiter segments, as described in further detail below.

Distributed Impedance Matching Embodiment

Figure 10:
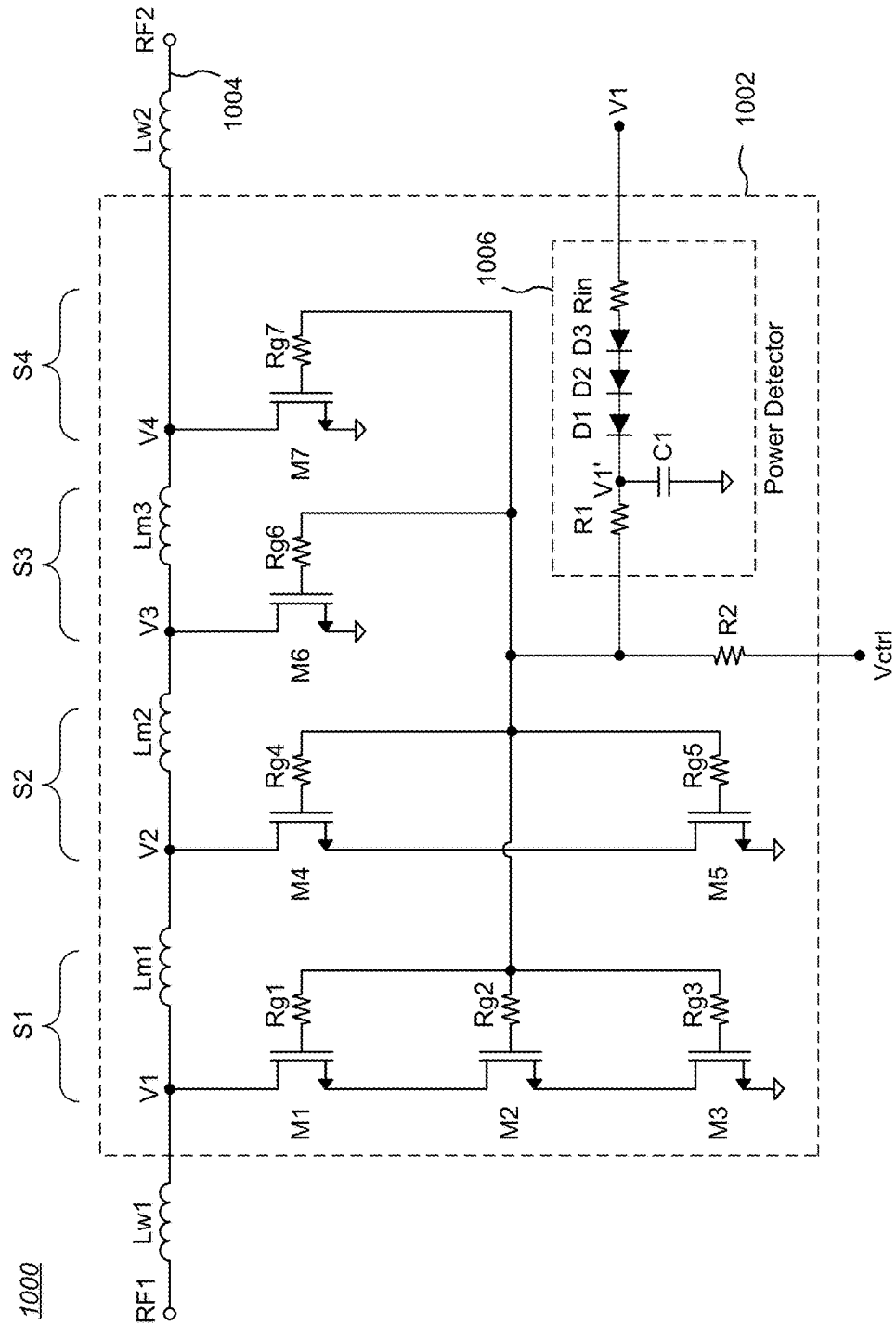
FIG. 10 is schematic diagram of an integrated circuit (IC) embodying an adjustable self-actuating broadband power limiter having multiple limiter segments, an optional tapered limiter segment architecture, and an optional integrated power detector.

FIG. 10 is schematic diagram 1000 of an integrated circuit (IC) 1002 embodying an adjustable self-actuating broadband power limiter having multiple limiter segments, an optional tapered limiter segment architecture, and an optional integrated power detector.

In the illustrated embodiment, four limiter segments S1-S4 (corresponding to the equivalent capacitances C1-Cn of FIG. 9) are coupled between circuit ground and a signal line 1004 between terminals RF1 and RF2. Each limiter segment S1-S4 comprises a stack of one or more field-effect transistors (FETs) M1-M7 each configured as a self-activating, adjustable threshold power limiter of the type shown in FIG. 3 and taught in the Adjustable Limiter References (for clarity, the capacitors associated with each FET M1-M7 as shown in FIG. 3 are omitted). In this particular example, the assignment of constituent FETs M1-M7 to limiter segments S1-S4 are set forth in TABLE 1.

TABLE 1

| Limiter Segment | Constituent FETs |
|---|---|
| S1 | M1, M2, M3 |
| S2 | M4, M5 |
| S3 | M6 |
| S4 | M7 |

For illustration purposes only in the following discussion, the FETs M1-M7 will be treated as NMOS type FETs. As is known in the art, the various control and bias voltages discussed below may have to be reversed in polarity when using PMOS type FETs for the FETs M1-M7. As should be clear, the number of limiter segments may be varied, as well as the number of FETs per limiter segment.

In the illustrated embodiment, each of the corresponding gate resistors Rg1-Rg7 of the constituent FETs M1-M7 in the limiter segments S1-S4 is coupled to a common control voltage, Vctrl. In the particular example shown in FIG. 10, all gate resistors within each limiter segment S1-S4 have the same value, but different gate resistor values may be used within a limiter segment for particular applications. For different limiter segments, the gate sizes may very (in general, gate resistors scale with FET size to keep RC constant for constant switching time; example: for a FET of 2× the size of a nominal FET, the gate resistor is ½ the value of the gate resistor of the nominal FET). In this example, Vctrl is coupled to the gate resistors Rg1-Rg7 through a common resistor R2. The threshold power point $P_{TH}$ for the limiter segments S1-S4 can be adjusted by biasing the gates of the FETs M1-M7 with Vctrl, thereby changing the voltage at which the limiter segments S1-S4 start conducting, which sets the limiting threshold power point $P_{TH}$. In most embodiments of the IC 1002, the control voltage Vctrl will be provided from an off-chip source.

Figure 4:
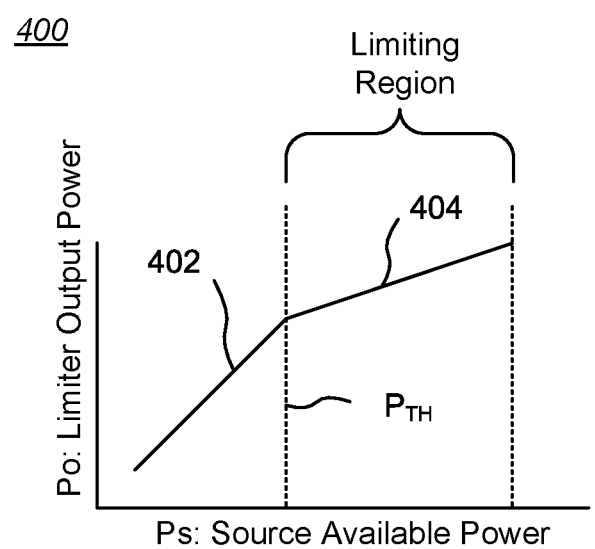
FIG. 4 is a graph showing the Ps-Po characteristic curve for a typical limiter of the type shown in FIG. 3.

As described above with respect to FIG. 3, each limiter segment S1-S4 limits the input power Ps of a signal on the signal line 1004 when the voltage on the signal line 1004 exceeds the breakdown voltage of the series-coupled FETs M1-M7 in at least one limiter segment S1-S4. By itself, this behavior of the limiter segments S1-S4 would initiate the limiting function shown in FIG. 4. As described further below, the limiting function can be improved in embodiments having an integrated power detector.

In the embodiment illustrated in FIG. 10, the bond wires or other connectors to external circuitry for the IC 1002 have an inherent (parasitic) inductance of Lw1, Lw2, which may be the same or different values. In addition, in accordance with the broadband power limiter concepts described above, the four limiter segments S1-S4 within the IC 1002 are separated from each other along the signal path 1004 by intermediate matching inductors, Lm1-Lm3. The values of the intermediate matching inductors Lm1-Lm3 are chosen to form, in combination with the capacitances of the limiter segments S1-S4 and the parasitic inductances Lw1 and Lw2, a transmission line between RF1 and RF2. Since the different limiter segments S1-S4 may present different capacitance as compared to each other, the intermediate matching inductors Lm1-Lm3 values are chosen (e.g., by modeling, calculation, or prototyping) to approximate an optimum transmission line, and thus may have the same or different values. This ensures that the distributed architecture is maintained, thereby maintaining improved bandwidth as described above.

Accordingly, by dividing the power limiting function into multiple segments, and introducing intermediate matching inductors, adjustable self-actuating broadband power limiters of the type shown in FIG. 10 improve insertion loss and thus increase bandwidth by approximating an optimum transmission line. In general, more segments better approximate an optimum transmission line, further improving bandwidth. For example, in one modeled embodiment of such a power limiter with four limiter segments compared to a power limiter with six limiter segments, bandwidth improved from 21 GHz up to 29 GHz (insertion loss=1.5 dB), even as the total capacitance and gate area of the FETs in the limiter segments remained constant. Therefore, the distributed multi-segment architecture of the current invention can provide a substantial increase in bandwidth (33% in this example) at no increase in size or cost, but solely by use of the new, innovative architecture.

It should be noted that while FIG. 10 shows adjustable self-actuating power limiters as components of the limiter segments S1-S4, the teachings of this description regarding dividing the power limiting function of a power limiting circuit into multiple segments for better broadband performance also applies to non-adjustable (fixed) self-actuating power limiters components. Further, some limiter segments may be configured with fixed self-actuating power limiters components, while other limiter segments may be configured with adjustable self-actuating power limiters components.

Tapered Limiter Segment Architecture

As should be clear from FIG. 10 and TABLE 1, the limiter segments S1-S4 need not all be identical in structure. In addition, the individual FETs within the limiter segments S1-S4 need not be identical. These characteristics can be utilized to create an optional "tapered" architecture for the limiter segments, which can further improve multiple characteristics of a broadband power limiter.

For example, the single FET M7 in limiter segment S4 may be configured with the narrowest transistor width of all of the FETs M1-M7. Limiter segment S4 also has the lowest stack height, a single FET, M7. That means that limiter segment S4 is the smallest of the four limiter segments S1-S4, giving it the lowest capacitance value, smallest area, and fastest response time. Similarly, single FET limiter segment S3 may be configured to initiate its power limiting action before limiter segments S1-S2, such as be configuring its FET M6 to be a wider transistor than FET M7. In the same manner, dual-FET limiter segment S2 may be configured to initiate its power limiting action before triple-FET limiter segments S1. Accordingly, the order of initiation of power limiting in the limiter segments S1-S4 may be "tapered" or "staggered".

With such a tapered architecture, as the input power Ps increases and exceeds $P_{TH}$, the smallest limiter segment, S4, will initiate its power limiting action before limiter segments S1-S3. This, in turn, reflects some power back toward the input, while absorbing some of the power in FET M7 (a FET has a finite $R_{ON}$ that absorbs power up to a maximum level set by its heat handling capability, which is in turn largely set by its area). The reflected power combines with the incoming power to increase the level of power seen by limiter segments S1-S3, thereby triggering their power limiting action. Thus, as each additional limiter segment initiates its power limiting action, additional power is reflected back toward the input, helping to trigger the power limiting action of the remaining limiter segments. This power limiting process continues as Ps increases, until all four limiter segments S1-S4 are in a power limiting mode.

Thus, at power levels for Ps just above the threshold power point $P_{TH}$ of limiter segment S4, it initiates its power limiting function rapidly and can handle the relatively low excess power. As Ps increases, limiter segment S3 starts power limiting, and due to its larger size, it can handle more power. The process continues as Ps increases, with limiter segment S2 and finally limiter segment S1 adding in their power limiting strength and power handling capability.

TABLE 2 sets forth one example of FET stack height and transistor size (Width/Length, where Width is the parameter of interest) per limiter segment S1-S4 (in this particular example, the limiter segments S3 and S4 are the same). In general, the width of each FET is proportional to the limiter segment stack height, thereby creating approximately equal capacitance for each distributed limiter segment.

TABLE 2

| Limiter Segment | FET Stack Height | Width/Length per FET |
| --- | --- | --- |
| S1 | 3 | 3600/0.25 |
| S2 | 2 | 2400/0.25 |
| S3 | 1 | 1200/0.25 |
| S4 | 1 | 1200/0.25 |

Accordingly, employing an optional tapered architecture for the broadband power limiter shown in FIG. 10 improves response time, improves power limiting properties (by optimizing different transistor sizes), and may improve linearity (again by optimizing transistor sizes), at equal or reduced size and cost.

Integrated Power Detector

Also shown in FIG. 10 is one embodiment of an optional power detector circuit 1006, shown connected between a node V1 on the signal line 1004, and the gate resistors Rg1-Rg7 of the FETs M1-M7 (the node V1 is between Lw1 and Lm1; the connecting line is omitted for clarity). The power detector circuit 1006 provides voltage rectification and control voltage generation, where the control voltage is a function of the signal power at node V1.

In the illustrated embodiment of one power detector circuit 1006, a resistor Rin is coupled to node V1 and to a rectifier circuit, shown as a stack of one or more series-connected diode elements (three in this example, D1-D3). The diode elements D1-D3 may be implemented, for example, as traditional diodes or as diode-connected FETs. The diode elements D1-D3 are also connected to a junction between a DC blocking capacitor C1 and a resistor R1, as shown. The capacitor C1 is also connected to circuit ground, and resistor R1 is also connected to the gate resistors Rg1-Rg7 of the FETs M1-M7 as well as to resistor R2.

The diode elements D1-D3 of the power detector circuit 1006 rectify the signal voltage present at node V1 and also serve to block voltage from Vctrl from being applied to the signal line. The output of the "bottom" diode D1 is integrated (i.e., smoothed) by the DC blocking capacitor C1 (also known as an integrating capacitor), thereby creating a DC voltage at V1' from the rectified signal that is representative of the peak signal voltage at node V1. The DC voltage at V1' is combined through resistors R1 and R2 with the control voltage Vctrl provided through resistor R2. The combined voltage, Vcombined, approximately equals Vctrl+ ([peak of V1]−m*$V_{TH}$)*R2/(R1+R2+Rin), where m is the number of diode elements D1-D3, and $V_{TH}$ is the turn-on voltage of an individual diode element. Vcombined is then coupled to the gate resistors Rg1-Rg7 of the FETs M1-M7, and sets the threshold power limiting level $P_{TH}$ for FETs M1-M7. A person of ordinary skill in the art will recognize that the power detector circuit 1006 comprising Rin, D1-D3, and C1 is a rectifier circuit that converts AC (RF) signals into DC voltages, and that other circuits may be used to perform the same function.

The voltage Vcombined is applied to the gate resistors Rg1-Rg7 of the FETs M1-M7 and modulates the ON resistance, $R_{ON}$, of the FETs M1-M7, reducing $R_{ON}$ when the voltage at V1 exceeds the combined turn-on voltage of all of the diode elements D1-D3. Accordingly, the limiting slope of a graph of the Ps-Po characteristic curve in the limiting region is a function not only of the control voltage Vctrl, but also of the transient signal voltage at node V1 and the values of resistors Rin, R1, and R2. Reducing the limiting slope by reducing $R_{ON}$ decreases the leakage power reaching a protected device.

Some additional power limiting protection may be provided by adding circuitry (not shown) that can latch in the voltage level at V1' or at Vcombined for an adjustable length of time to provide some hysteresis to the circuit, so that a minimum duration of power limiting is applied during a stress event.

A notable advantage of the inventive power limiter is that the threshold power point $P_{TH}$ of the limiter is adjustable by setting various values for the control voltage Vctrl, and a more ideal limiting function can be achieved by further controlling the threshold power point $P_{TH}$ of the limiter by means of a fast-response integrated power detector. Further details regarding implementation and usage of the optional power detector circuit 1006 may be found in the related co-pending U.S. Patent Application incorporated by reference above.

Embodiment Options

In the illustrated embodiments, the control voltage Vctrl can be provided in various ways. For example, as shown in the Adjustable Limiter References, Vctrl may be a DC voltage source coupled directly to resistor R2 in FIG. 10. In other embodiments, a switch (which may be internal to the IC 1002) my selectively connect a DC voltage source to resistor R2 for a time, and then later disconnect the voltage source, thereby creating a floating bias voltage for the gates of the FETs M1-M7.

In addition to controlling the threshold power point $P_{TH}$ of a limiter by setting different values for Vctrl, in a FET implementation of the invention in a particular technology, the slope of Po/Ps in the limiting region is determined by the width to length (W/L) geometry of the FET structure, where W is the gate width and L is the gate length: a larger W/L ratio of the FET results in a flatter Po/Ps slope. Accordingly, a limiter in accordance with the present invention can be "tuned" by an appropriate choice of FET design parameters during design and fabrication.

For clarity, the term "self-activating power limiter" includes a device or devices (such as a stack of individual devices) having an adjustable limiting threshold, each device including:

at least one switching element, each having a control input, a signal input, and an output;

each switching element having a first coupling element electrically connected from the signal input of such switching element to the control input of such switching element;

each switching element having a second coupling element electrically connected from the control input of such switching element to the output of such switching element; and at least one control voltage source electrically coupled to the control inputs of the at least one switching element to adjustably control the limiting threshold of the limiter.

The coupling elements referenced above including capacitive coupling elements. Further, each switching element may be in a non-conductive state while the signal input is below a selected level determined by the limiting threshold, and in a controlled variable impedance state while the signal input is above a selected level determined by the limiting threshold, the signal input being limited while the switching element is in the controlled variable impedance state. Other forms of self-activating power limiters are described in the Adjustable Limiter References.

Linearity Improvement

The linearity of a FET implementation of the limiter of the present invention can be improved by providing a means for sweeping out accumulated charge trapped below the gate oxide of each FET M1-Mn, such as by use of the "HaRP"™ accumulated charge sink (ACS) technology taught in the following U.S. Patents, all of which are assigned to the assignee of the present invention and incorporated herein by this reference: U.S. Pat. No. 7,890,891, issued Feb. 15, 2011, entitled "Method and Apparatus Improving Gate Oxide Reliability by Controlling Accumulated Charge"; U.S. Pat. No. 7,910,993, issued on Mar. 22, 2011, entitled "Method and Apparatus for Use in Improving Linearity of MOSFETS Using an Accumulated Charge Sink"; U.S. Pat. No. 8,129,787, issued on Mar. 6, 2012, entitled "Method and Apparatus for use in Improving Linearity of MOSFETs Using an Accumulated Charge Sink"; U.S. Pat. No. 8,405,147, issued on Mar. 26, 2013, entitled "Method and Apparatus for Use in Improving Linearity of MOSFETs Using an Accumulated Charge Sink"; U.S. Pat. No. 8,742,502, issued on Jun. 3, 2014, entitled "Method and Apparatus for Use in Improving Linearity of MOSFETs Using an Accumulated Charge Sink-Harmonic Wrinkle Reduction".

Figure 11A:
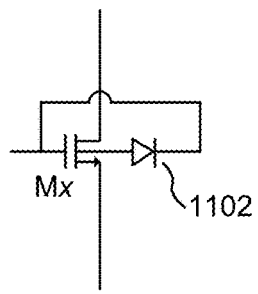
FIG. 11A is a schematic diagram of a FET Mx having the anode of a diode electrically connected to the body of the FET Mx, with the cathode electrically connected to the gate of the FET Mx.
Figure 11B:
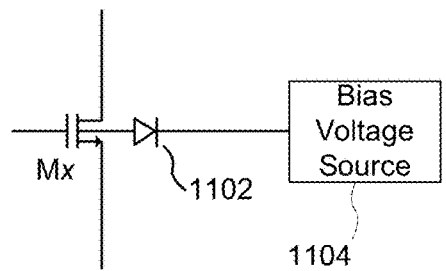
FIG. 11B is a schematic diagram of a FET Mx having the anode of a diode electrically connected to the body of the FET Mx, with the cathode electrically connected to a separate bias voltage source.

An easy way to implement such an accumulated charge sweeping means is by electrically coupling a diode to the substrate of each FET M1-Mn in an embodiment of an adjustable self-actuating broadband power limiter in accordance with the present invention. For example, FIG. 11A is a schematic diagram of a FET Mx having the anode of a diode 1102 electrically connected to the body of the FET Mx, with the cathode electrically connected to the gate of the FET Mx. As another example, FIG. 11B is a schematic diagram of a FET Mx having the anode of a diode 1102 electrically connected to the body of the FET Mx, with the cathode electrically connected to a separate bias voltage source 1104. In both FIG. 11A and FIG. 11B, the voltage applied to the diode is negative with respect to the source, the gate, and ground of the system. This voltage ensures that all accumulated charge (holes, in this case of an NMOSFET) are removed by the negative voltage supply. Removal of this accumulated charge reduces or minimizes the non-linear interactions with a signal (particularly an RF signal) that would otherwise occur. Adding an accumulated charge sink structure to a FET Mx, such as the diode 1102 shown in FIG. 11A and FIG. 11B, provides superior linearity compared to prior art approaches.

Applications

Self-activating, adjustable threshold broadband power limiters in accordance with the present invention are useful in a wide variety of electronic circuits. As in the examples above, such a limiter may be electrically coupled between a signal source (e.g., a wired or wireless communication signal) and a receiver. Other examples include electrically coupling such a limiter: (1) between non-power sensitive electronic components and power sensitive electronic components, such as might occur at the front end (input) of a test instrument; (2) between an antenna and a wireless receiver, such as a radar system, a wireless base-station receiver, or a wireless broadband receiver; and (3) to the output of a power amplifier, to limit power excursions and transients at the output. Such limiters may also be used in various circuits to provide protection against electrostatic discharge (ESD).

Multiple self-activating, adjustable threshold broadband power limiters in accordance with the present invention, can be grouped together in parallel or series to offer customized limiting characteristics. For example, two or more of such limiters may be electrically coupled in parallel; each of the limiters may have the same limiting threshold, or some or all of the limiters may have different limiting thresholds, to provide a customized limiting effect. As another example, two or more of such limiters may be electrically coupled in series; again, each of the limiters may have the same limiting threshold, or some or all of the limiters may have different limiting thresholds, to provide a customized limiting effect. In some embodiments, the limiters may be coupled to switches to allow one or more limiters to be switched into or out of circuit. In any case, the control voltages for each of the limiters may be provided by a discrete or integrated multiple output circuit, such as a positive and/or negative voltage generator.

It will be appreciated by practitioners in the art that the parallel and series configurations described above can be used alone or combined into a wide variety of configurations, such as to handle unique power situations, provide specialized limiting thresholds, or handle particular frequency regimes. For example, a set of series-connected limiters may have different threshold levels, turning on successively as signal power Ps continues to increase, in order to provide additional attenuation of the signal power.

A self-activating, adjustable threshold broadband power limiter in accordance with the present invention may be coupled between a source and multiple branches of N parallel sets of elements, such as filters and receivers, such as may be used in a multi-path or multi-band wireless or wired receiver system (e.g., multi-band cellular telephone systems, base stations, phased-array radar, and test equipment).

Two or more self-activating, adjustable threshold broadband power limiters in accordance with the present invention may be electrically coupled between corresponding filters and receivers in two or more parallel branches, with each of the branches electrically coupled to a single source, such as may be used in a multi-path or multi-band wireless or wired receiver system (including the above examples). Such a configuration is particularly useful because the invention lends itself readily to integration with other circuitry, and makes it cost-effective to providing limiting on multiple branches or multiple ports and paths within an integrated circuit system. For example, the power in each filtered frequency band may differ significantly from band to band, and thus providing a self-activating, adjustable threshold broadband power limiter after each filter may be particularly useful in protecting each receiver that might be exposed to excessive power within its respective frequency band.

A self-activating, adjustable threshold broadband power limiter in accordance with the present invention may be electrically coupled in a single ended form (i.e., with one connection to circuit ground) to a digitally tuned capacitor circuit comprising an inductor and N branches each comprising a capacitor and a switch. Alternatively, such a limiter may be electrically coupled in a differential form (i.e., with one connection to each of two rails) to a digitally tuned capacitor circuit comprising a first rail having a first inductor, a second rail having a second inductor, and N branches spanning the rails, each branch comprising a capacitor and a switch. The structure and implementation of such digitally tuned capacitor circuits is further described in U.S. Pat. No. 9,024,700, issued May 5, 2015, entitled "Method and Apparatus for Use in Digitally Tuning a Capacitor in an Integrated Circuit Device", assigned to the assignee of the present invention and incorporated herein by this reference as if set forth in full.

Methods

Another aspect of the invention includes methods for limiting power of an applied signal by means of a broadband power limiter circuit having an adjustable limiting threshold and a distributed architecture.

Figure 12:
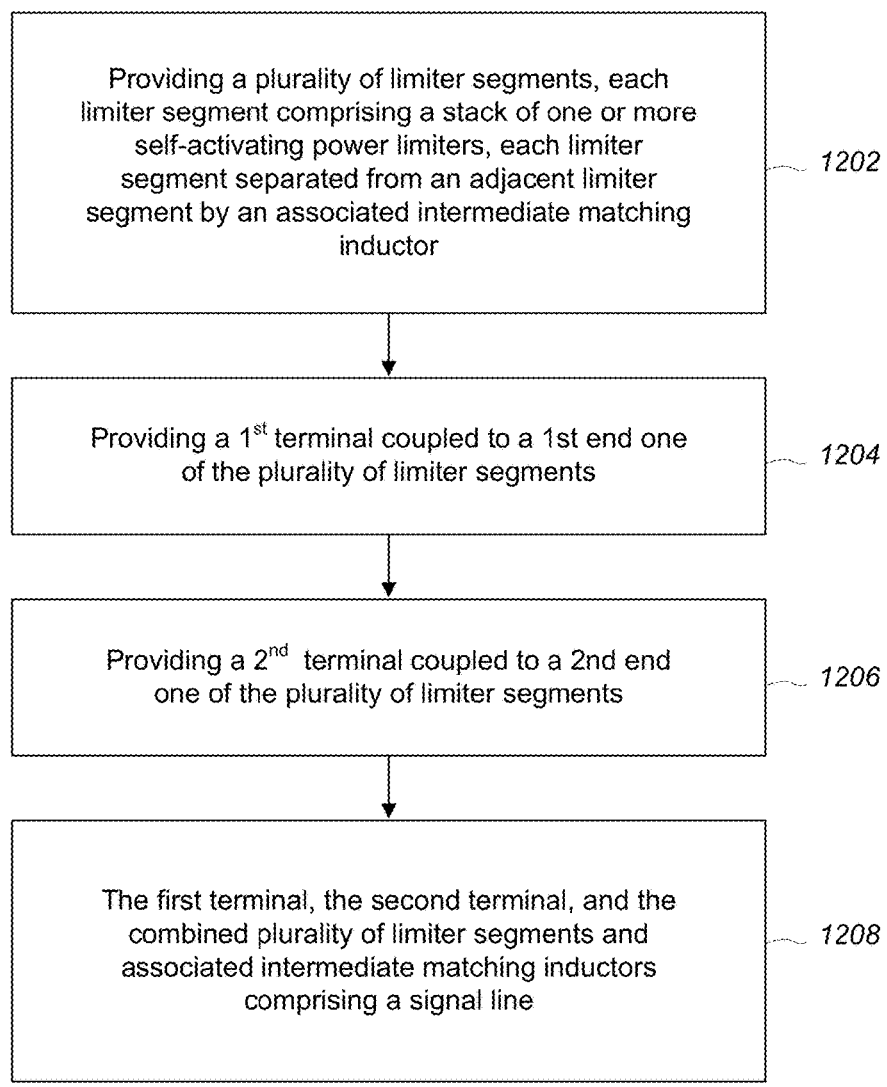
FIG. 12 is a process chart showing a first method for limiting power of an applied signal by means of a broadband power limiter circuit having an adjustable limiting threshold and a distributed architecture.

For example, FIG. 12 is a process chart 1200 showing a first method for limiting power of an applied signal by means of a broadband power limiter circuit having an adjustable limiting threshold and a distributed architecture, including: providing a plurality of limiter segments, each limiter segment comprising a stack of one or more self-activating power limiters, each limiter segment separated from an adjacent limiter segment by an associated intermediate matching inductor (STEP 1202); providing a first terminal coupled to a first end one of the plurality of limiter segments (STEP 1204); and providing a second terminal coupled to a second end one of the plurality of limiter segments (STEP 1206); wherein the first terminal, the second terminal, and the combined plurality of limiter segments and associated intermediate matching inductors comprise a signal line (STEP 1208).

This method may also encompass: at least one limiter segment having a stack height less than at least one other limiter segment; configuring at least one limiter segment to initiate power limiting before at least one other limiter segment initiates power limiting; at least one self-activating power limiter being adjustable and including a threshold control input configured to be coupled to an applied corresponding control signal, and further including: providing a power detector circuit, coupled to the threshold control input of at least one self-activating adjustable power limiter and configured to be coupled to a node on the signal line, for generating a second control signal as a function of the signal power at the node; and combining the applied corresponding control signal and the second control signal at the coupled threshold control input of the at least one self-activating adjustable power limiter to control the limiting threshold of the corresponding limiter segment, thereby providing a more ideal limiting function for each limiter segment; the power detector circuit including a rectifier subcircuit comprising one or more series-connected diodes; the power detector circuit including a first resistor configured to be coupled to the node, one or more series-connected diodes coupled in series to the first resistor, a capacitor coupled in series to the one or more series-connected diodes and configured to be coupled to circuit ground, and a second resistor coupled between the junction of the one or more series-connected diodes and the capacitor and to the threshold control input of the at least one self-activating adjustable power limiter; configuring the broadband power limiter circuit to limit excessive power from a source of radio frequencies; the combination of the plurality of limiter segments and associated intermediate matching inductors forming a transmission line that approximates an optimum transmission line; and fabricating the broadband power limiter circuit as an integrated circuit using a silicon-on-insulator (SOI) or silicon-on-sapphire (SOS) process.

Figure 13:
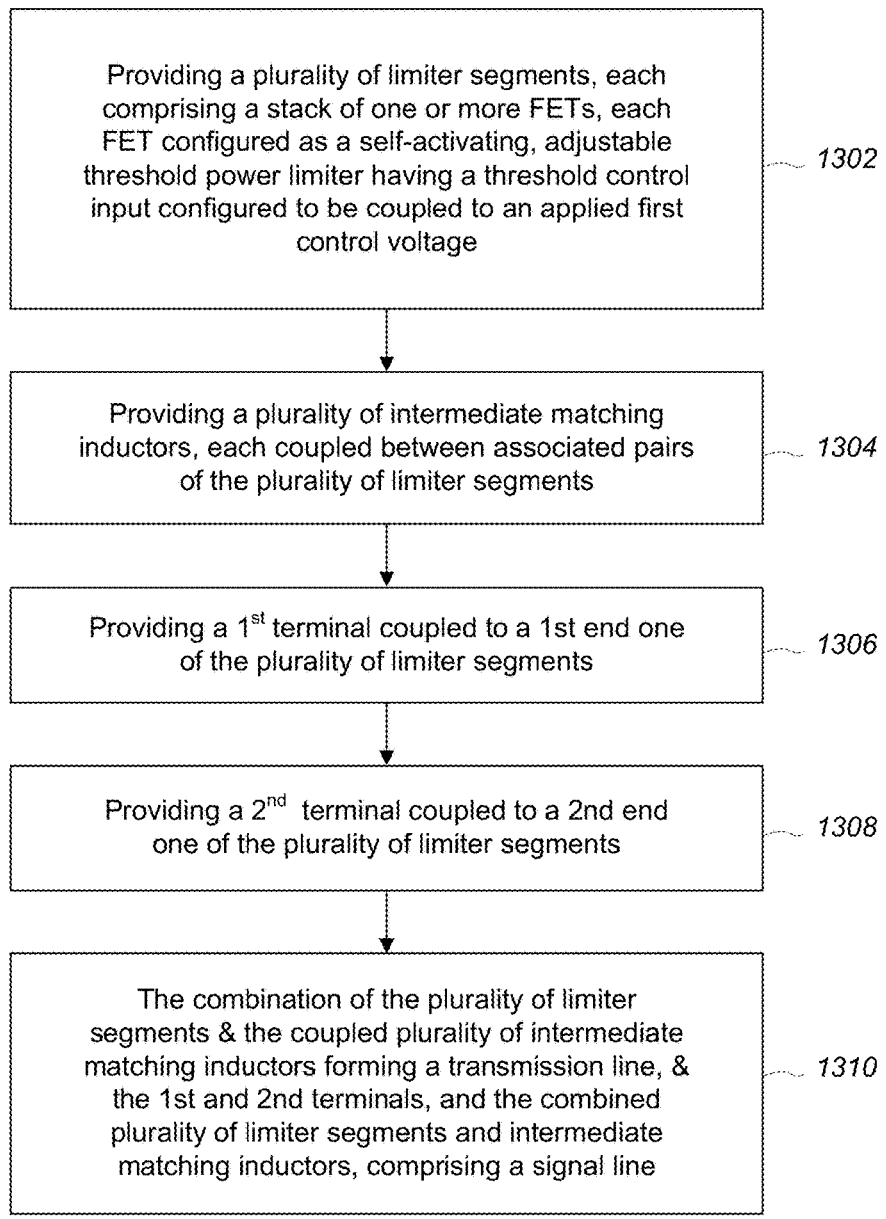
FIG. 13 is a process chart showing a second method for limiting power of an applied signal by means of a broadband power limiter circuit having an adjustable limiting threshold and a distributed architecture.

As another example, FIG. 13 is a process chart 1300 showing a second method for limiting power of an applied signal by means of a broadband power limiter circuit having an adjustable limiting threshold and a distributed architecture, including: providing a plurality of limiter segments, each comprising a stack of one or more field-effect transistors (FETs), each FET configured as a self-activating, adjustable threshold power limiter having a threshold control input configured to be coupled to an applied first control voltage (STEP 1302); providing a plurality of intermediate matching inductors, each coupled between associated pairs of the plurality of limiter segments (STEP 1304); providing a first terminal coupled to a first end one of the plurality of limiter segments (STEP 1306); providing a second terminal coupled to a second end one of the plurality of limiter segments (STEP 1308); wherein the combination of the plurality of limiter segments and the coupled plurality of intermediate matching inductors forms a transmission line, and wherein the first terminal, the second terminal, and the combined plurality of limiter segments and intermediate matching inductors comprise a signal line (STEP 1310).

This method may also encompass: at least one limiter segment having a stack height less than at least one other limiter segment; configuring at least one limiter segment to initiate power limiting before at least one other limiter segment initiates power limiting; providing a power detector circuit, coupled to the threshold control input of each power limiter and configured to be coupled to a node on the signal line, for generating a second control voltage as a function of the signal power at the node; and combining the applied first control voltage and the second control voltage at the threshold control inputs of the power limiters to control the limiting threshold of each limiter segment, thereby providing a more ideal limiting function for each limiter segment; the power detector circuit including a rectifier subcircuit comprising one or more series-connected diodes; the power detector circuit including a first resistor configured to be coupled to the node, one or more series-connected diodes coupled in series to the first resistor, a capacitor coupled in series to the one or more series-connected diodes and configured to be coupled to circuit ground, and a second resistor coupled between the junction of the one or more series-connected diodes and the capacitor and to the threshold control inputs of the power limiters; configuring the broadband power limiter circuit to limit excessive power from a source of radio frequencies; configuring each FET with an accumulated charge sink structure; the accumulated charge sink structure including a diode; the formed transmission line approximating an optimum transmission line; and fabricating the broadband power limiter circuit as an integrated circuit using a silicon-on-insulator (SOI) or silicon-on-sapphire (SOS) process.

Fabrication Technologies and Options

As should be clear, embodiments of an adjustable self-actuating broadband power limiter having multiple limiter segments may include none, one, or both of a tapered limiter segment architecture and an integrated power detector.

The FETs in the limiter segments S1-S4 of FIG. 10 may be fabricated on an IC 1002 using any technology in which individual FETs can be sufficiently isolated from each other to enable stacking and voltage division, such as standard silicon (Si), silicon on insulator (SOI), silicon on sapphire (SOS), HR Si, SI Si, multi-well CMOS, or GaAs technology. As noted above, such stacking provides a higher effective Vmax_total for the limiter circuitry as a whole.

In additional, all elements of the adjustable self-actuating broadband power limiter of FIG. 10 may be fabricated in a single integrated circuit made in any of multiple semiconductor technologies, including but not limited to SOI, SOS, bulk Si, GaAS, or other FET-based semiconductor technologies.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A broadband power limiter circuit having a distributed architecture, the broadband power limiter circuit including:
    (a) a plurality of limiter segments, each limiter segment comprising a stack of one or more self-activating power limiters, each limiter segment separated from an adjacent limiter segment by an associated intermediate matching inductor, each limiter segment configured to initiate limiting of at least one of power, voltage, or current of a signal applied to such limiter segment only when such power, voltage, or current exceeds a set threshold for such limiter segment;
    (b) a first terminal coupled to a first end one of the plurality of limiter segments; and
    (c) a second terminal coupled to a second end one of the plurality of limiter segments;
    wherein the first terminal, the second terminal, and the combined plurality of limiter segments and associated intermediate matching inductors comprise a signal line.

2. The invention of claim 1, wherein at least one limiter segment has a stack height less than at least one other limiter segment.

3. The invention of claim 1, wherein at least one limiter segment is configured to initiate limiting before at least one other limiter segment initiates limiting.

4. The invention of claim 1, wherein at least one self-activating power limiter is adjustable and includes a threshold control input configured to be coupled to an applied corresponding control signal, and further including a power detector circuit, coupled to the threshold control input of at least one self-activating adjustable power limiter and configured to be coupled to a node on the signal line, for generating a second control signal as a function of the signal power at the node, wherein the applied corresponding control signal and the second control signal are combined at the coupled threshold control input of the at least one self-activating adjustable power limiter to control the limiting threshold of the corresponding limiter segment, thereby providing a more ideal limiting function for each limiter segment.

5. The invention of claim 4, wherein the power detector circuit includes a rectifier subcircuit comprising one or more series-connected diodes.

6. The invention of claim 4, wherein the power detector circuit includes a first resistor configured to be coupled to the node, one or more series-connected diodes coupled in series to the first resistor, a capacitor coupled in series to the one or more series-connected diodes and configured to be coupled to circuit ground, and a second resistor coupled between the junction of the one or more series-connected diodes and the capacitor and to the threshold control input of the at least one self-activating adjustable power limiter.

7. The invention of claim 1, wherein the broadband power limiter circuit is configured to limit power from a source of radio frequencies.

8. The invention of claim 1, wherein the combination of the plurality of limiter segments and associated intermediate matching inductors form a transmission line that approximates an optimum transmission line.

9. The invention of claim 1, wherein the broadband power limiter circuit is fabricated using a silicon-on-insulator (SOI) or silicon-on-sapphire (SOS) process.

10. A broadband power limiter circuit having an adjustable limiting threshold and a distributed architecture, the broadband power limiter circuit including:
(a) a plurality of limiter segments, each comprising a stack of one or more field-effect transistors (FETs), each FET configured as a self-activating, adjustable threshold power limiter having a threshold control input configured to be coupled to an applied first control voltage, each limiter segment configured to initiate limiting of at least one of power, voltage, or current of a signal applied to such limiter segment only when such power, voltage, or current exceeds a set threshold for such limiter segment;
(b) a plurality of intermediate matching inductors, each coupled between associated pairs of the plurality of limiter segments;
(c) a first terminal coupled to a first end one of the plurality of limiter segments; and
(d) a second terminal coupled to a second end one of the plurality of limiter segments;
wherein the combination of the plurality of limiter segments and the coupled plurality of intermediate matching inductors forms a transmission line, and wherein the first terminal, the second terminal, and the combined plurality of limiter segments and intermediate matching inductors comprise a signal line.

11. The invention of claim 10, wherein at least one limiter segment has a stack height less than at least one other limiter segment.

12. The invention of claim 10, wherein at least one limiter segment is configured to initiate limiting before at least one other limiter segment initiates limiting.

13. The invention of claim 10, further including a power detector circuit, coupled to the threshold control input of each power limiter and configured to be coupled to a node on the signal line, for generating a second control voltage as a function of the signal power at the node, wherein the applied first control voltage and the second control voltage are combined at the threshold control inputs of the power limiters to control the limiting threshold of each limiter segment, thereby providing a more ideal limiting function for each limiter segment.

14. The invention of claim 13, wherein the power detector circuit includes a rectifier subcircuit comprising one or more series-connected diodes.

15. The invention of claim 13, wherein the power detector circuit includes a first resistor configured to be coupled to the node, one or more series-connected diodes coupled in series to the first resistor, a capacitor coupled in series to the one or more series-connected diodes and configured to be coupled to circuit ground, and a second resistor coupled between the junction of the one or more series-connected diodes and the capacitor and to the threshold control inputs of the power limiters.

16. The invention of claim 10, wherein the broadband power limiter circuit is configured to limit power from a source of radio frequencies.

17. The invention of claim 10, wherein each FET includes an accumulated charge sink structure.

18. The invention of claim 17, wherein the accumulated charge sink structure includes a diode.

19. The invention of claim 10, wherein the formed transmission line approximates an optimum transmission line.

20. The invention of claim 10, wherein the broadband power limiter circuit is fabricated using a silicon-on-insulator (SOI) or silicon-on-sapphire (SOS) process.

21. A method for limiting power of an applied signal by means of a broadband power limiter circuit having a distributed architecture, including:
(a) providing a plurality of limiter segments, each limiter segment comprising a stack of one or more self-activating power limiters, each limiter segment separated from an adjacent limiter segment by an associated intermediate matching inductor, each limiter segment configured to initiate limiting of at least one of power, voltage, or current of a signal applied to such limiter segment only when such power, voltage, or current exceeds a set threshold for such limiter segment;
(b) providing a first terminal coupled to a first end one of the plurality of limiter segments; and
(c) providing a second terminal coupled to a second end one of the plurality of limiter segments;
wherein the first terminal, the second terminal, and the combined plurality of limiter segments and associated intermediate matching inductors comprise a signal line.

22. The method of claim 21, wherein at least one limiter segment has a stack height less than at least one other limiter segment.

23. The method of claim 21, further including configuring at least one limiter segment to initiate limiting before at least one other limiter segment initiates limiting.

24. The method of claim 21, wherein at least one self-activating power limiter is adjustable and includes a threshold control input configured to be coupled to an applied corresponding control signal, and further including: providing a power detector circuit, coupled to the threshold control input of at least one self-activating adjustable power limiter and configured to be coupled to a node on the signal line, for generating a second control signal as a function of the signal power at the node; and combining the applied corresponding control signal and the second control signal at the coupled threshold control input of the at least one self-activating adjustable power limiter to control the limiting threshold of the corresponding limiter segment, thereby providing a more ideal limiting function for each limiter segment.

25. The method of claim 24, wherein the power detector circuit includes a rectifier subcircuit comprising one or more series-connected diodes.

26. The method of claim 24, wherein the power detector circuit includes a first resistor configured to be coupled to the node, one or more series-connected diodes coupled in series to the first resistor, a capacitor coupled in series to the one or more series-connected diodes and configured to be coupled to circuit ground, and a second resistor coupled between the junction of the one or more series-connected diodes and the capacitor and to the threshold control input of the at least one self-activating adjustable power limiter.

27. The method of claim 21, further including configuring the broadband power limiter circuit to limit power from a source of radio frequencies.

28. The method of claim 21, wherein the combination of the plurality of limiter segments and associated intermediate matching inductors forms a transmission line that approximates an optimum transmission line.

29. The method of claim 21, further including fabricating the broadband power limiter circuit as an integrated circuit using a silicon-on-insulator (SOI) or silicon-on-sapphire (SOS) process.

30. A method for limiting power of an applied signal by means of a broadband power limiter circuit having an adjustable limiting threshold and a distributed architecture, including:
  (a) providing a plurality of limiter segments, each comprising a stack of one or more field-effect transistors (FETs), each FET configured as a self-activating, adjustable threshold power limiter having a threshold control input configured to be coupled to an applied first control voltage, each limiter segment configured to initiate limiting of at least one of power, voltage, or current of a signal applied to such limiter segment only when such power, voltage, or current exceeds a set threshold for such limiter segment;
  (b) providing a plurality of intermediate matching inductors, each coupled between associated pairs of the plurality of limiter segments;
  (c) providing a first terminal coupled to a first end one of the plurality of limiter segments;
  (d) providing a second terminal coupled to a second end one of the plurality of limiter segments;
  wherein the combination of the plurality of limiter segments and the coupled plurality of intermediate matching inductors forms a transmission line, and wherein the first terminal, the second terminal, and the combined plurality of limiter segments and intermediate matching inductors comprise a signal line.

31. The method of claim 30, wherein at least one limiter segment has a stack height less than at least one other limiter segment.

32. The method of claim 30, further including configuring at least one limiter segment to initiate limiting before at least one other limiter segment initiates limiting.

33. The method of claim 30, further including: providing a power detector circuit, coupled to the threshold control input of each power limiter and configured to be coupled to a node on the signal line, for generating a second control voltage as a function of the signal power at the node; and combining the applied first control voltage and the second control voltage at the threshold control inputs of the power limiters to control the limiting threshold of each limiter segment, thereby providing a more ideal limiting function for each limiter segment.

34. The method of claim 33, wherein the power detector circuit includes a rectifier subcircuit comprising one or more series-connected diodes.

35. The method of claim 33, wherein the power detector circuit includes a first resistor configured to be coupled to the node, one or more series-connected diodes coupled in series to the first resistor, a capacitor coupled in series to the one or more series-connected diodes and configured to be coupled to circuit ground, and a second resistor coupled between the junction of the one or more series-connected diodes and the capacitor and to the threshold control inputs of the power limiters.

36. The method of claim 30, further including configuring the broadband power limiter circuit to limit power from a source of radio frequencies.

37. The method of claim 30, further including configuring each FET with an accumulated charge sink structure.

38. The method of claim 37, wherein the accumulated charge sink structure includes a diode.

39. The method of claim 30, wherein the formed transmission line approximates an optimum transmission line.

40. The method of claim 30, further including fabricating the broadband power limiter circuit as an integrated circuit using a silicon-on-insulator (SOI) or silicon-on-sapphire (SOS) process.

* * * * *